United States Patent
Mou

(10) Patent No.: US 10,620,536 B2
(45) Date of Patent: Apr. 14, 2020

(54) COLOR RESIST MATERIAL OF COLOR FILTER AND METHOD FOR PREPARING COLOR RESIST PATTERN OF COLOR FILTER

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventor: Guangying Mou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 129 days.

(21) Appl. No.: 15/937,967

(22) Filed: Mar. 28, 2018

(65) Prior Publication Data
US 2019/0121234 A1 Apr. 25, 2019

(30) Foreign Application Priority Data
Oct. 19, 2017 (CN) .......................... 2017 1 0980441

(51) Int. Cl.
| | | |
|---|---|---|
| G03F 7/027 | (2006.01) | |
| G02B 5/20 | (2006.01) | |
| G03F 7/033 | (2006.01) | |
| G03F 7/00 | (2006.01) | |
| G03F 7/16 | (2006.01) | |
| G03F 7/20 | (2006.01) | |
| G03F 7/40 | (2006.01) | |
| G03F 7/031 | (2006.01) | |
| G03F 7/038 | (2006.01) | |

(Continued)

(52) U.S. Cl.
CPC ............ *G03F 7/033* (2013.01); *G03F 7/0007* (2013.01); *G03F 7/027* (2013.01); *G03F 7/031* (2013.01); *G03F 7/038* (2013.01); *G03F 7/039* (2013.01); *G03F 7/105* (2013.01); *G03F 7/16* (2013.01); *G03F 7/168* (2013.01); *G03F 7/20* (2013.01); *G03F 7/322* (2013.01); *G03F 7/40* (2013.01); *G02B 5/223* (2013.01); *G02F 1/133516* (2013.01); *G02F 2202/02* (2013.01)

(58) Field of Classification Search
CPC ........ G03F 7/0007; G03F 7/027; G03F 7/031; G03F 7/033; G03F 7/105; G02B 5/223; G02F 1/133514; G02F 1/133516
USPC ................................................ 430/7; 349/106
See application file for complete search history.

(56) References Cited

U.S. PATENT DOCUMENTS

| | | | |
|---|---|---|---|
| 2014/0145286 A1* | 5/2014 | Aoyagi | ............ H01L 27/14621 257/432 |
| 2014/0212532 A1 | 7/2014 | Ganapathiappan et al. | |
| 2016/0313641 A1 | 10/2016 | De et al. | |

FOREIGN PATENT DOCUMENTS

| | | |
|---|---|---|
| CN | 101985531 A | 3/2011 |
| CN | 104407468 A | 3/2015 |

(Continued)

OTHER PUBLICATIONS

First Office Action for Chinese Patent Application No. 201710980441.6 dated Sep. 30, 2019.

*Primary Examiner* — John A McPherson
(74) *Attorney, Agent, or Firm* — Calfee, Halter & Griswold LLP

(57) ABSTRACT

A color resist material of a color filter and a method for preparing a color resist pattern of a color filter are provided.

(Continued)

The color resist material of a color filter includes: a polyfunctional monomer including a divinylbenzene monomer.

11 Claims, 4 Drawing Sheets

(51) Int. Cl.
*G03F 7/039* (2006.01)
*G03F 7/32* (2006.01)
*G03F 7/105* (2006.01)
*G02F 1/1335* (2006.01)
*G02B 5/22* (2006.01)

(56) References Cited

FOREIGN PATENT DOCUMENTS

| CN | 104749881 A | 7/2015 |
| KR | 20160115338 A | 10/2016 |
| WO | 2017017428 A1 | 2/2017 |

* cited by examiner

COLOR RESIST MATERIAL OF COLOR FILTER AND METHOD FOR PREPARING COLOR RESIST PATTERN OF COLOR FILTER

CROSS REFERENCE

The present application claims the priority of Chinese Patent Application No. 201710980441.6, titled "Color resist material of color filter and method for preparing color resist pattern of color filter", and filed on Oct. 19, 2017, and the entire contents thereof are incorporated herein by reference.

TECHNICAL FIELD

The present disclosure relates to the field of display technology, and in particular, to a color resist material of a color filter and a method for preparing a color resist pattern.

BACKGROUND

The color filter is an important component for filtering a backlight (white light) to form three primary colors of red (R), green (G), and blue (B) in a TFT-LCD (thin film transistor-liquid crystal display) panel. A color resist is a main film layer for filtering the white light on the color filter. When irradiated by the white light, the color resist will reflect a monochromatic light (RGB), and the color resist material will absorb the light of other wavelengths to form a desired color. In actual production and application, electrical properties of the color resist material will be affected by the light irradiation (ultraviolet light, visible light).

A conventional color resist material has low electrical stability. For example, the pigment component in the green resist material contains metal ions such as Zn, which makes it have semiconductor properties and it is likely to induce electron migration under light irradiation, resulting in an increase in a medium loss rate. When a voltage difference is formed between an inductive charge of a black matrix (BM) at a color film side and a common electrode (Vcom) at the TFT side, the electron migration in the green resist material will cause increase of a liquid crystal (LC) electric field, resulting in excessive deflection of the peripheral LC, heavier greening of the periphery of the pixel, and defect of mura of the irradiated green light.

There are few types of structures of available green (G) color resist currently. The color resist structures with higher color chroma all contain metal Zn, which is a main structural unit that produces electron migration due to light irradiation, and affects the electrical stability of the color resist material. In order to reduce a dielectric loss factor after the light irradiation, a G color resist with higher color chroma is generally chosen to replace the original color resist, thereby reducing the G color resist content. However, this method has following defects: (1) the color resist content is reduced, and there is a risk that the color transmittance is reduced; (2) the inherent characteristics of the material are not changed, and there is still a risk of increased dielectric loss factor caused by electron migration under deteriorated conditions.

Therefore, there is an urgent need for a color resist material with high electrical stability.

It should be noted that, information disclosed in the above background portion is provided only for better understanding of the background of the present disclosure, and thus it may contain information that does not form the prior art known by those ordinary skilled in the art.

SUMMARY

An embodiment of the present disclosure provides a color resist material of a color filter, including: a polyfunctional monomer including a divinylbenzene monomer.

In an exemplary embodiment, the color resist material further includes a resin, a photoinitiator, a pigment, a pigment dispersant, a solvent, and an additive.

In an exemplary embodiment, the polyfunctional monomer further includes an acrylate.

In an exemplary embodiment, the acrylate includes any one or more of pentaerythritol triacrylate (PETA), pentaerythritol tetraacrylate (PETA), polydipentaerythritol pentaacrylate (DPEPA) and hexaacrylate (DPHA).

In an exemplary embodiment, a mass ratio of the divinylbenzene monomer to the acrylate is 1:0 to 1:1.

In an exemplary embodiment, in the color resist material, a proportion of a mass of the resin to a total mass of the color resist material is 5-8%, a proportion of a mass of the polyfunctional monomer to the total mass of the color resist material is 5-8%, a proportion of a mass of the photoinitiator to the total mass of the color resist material is 0.2-0.6%, a proportion of a mass of the pigment to the total mass of the color resist material is 5-8%, a proportion of a mass of the pigment dispersant to the total mass of the color resist material is 5-8%, a proportion of a mass of the solvent to the total mass of the color resist material is 67-78%, and a proportion of a mass of the additive to the total mass of the color resist material is 0.1-0.4%.

In an exemplary embodiment, the resin includes one of a methyl methacrylate (MMA) agent and butyl methacrylate (BMA) or a combination thereof, and/or the solvent includes propylene glycol methyl ether.

In an exemplary embodiment, the photoinitiator includes Benzophenone or S-triazine, and/or the additive includes a silane coupling agent.

In an exemplary embodiment, the pigment includes a green pigment, and/or the pigment dispersant includes a polymer dispersant.

The present disclosure provides a method for preparing a color resist pattern of a color filter, including: preparing a color resist material solution including a polyfunctional monomer, the polyfunctional monomer including a divinylbenzene monomer; and fixing the prepared color resist material solution on the color filter, to obtain a color resist pattern.

In an exemplary embodiment, the preparing a color resist material solution including a polyfunctional monomer includes mixing the polyfunctional monomer, a resin, a photoinitiator, a pigment, a pigment dispersant, a solvent, and an additive.

In an exemplary embodiment, the fixing the prepared color resist material solution on the color filter, to obtain a color resist pattern includes curing, exposing, developing, and post-baking steps, the curing includes curing at a temperature of 80-100° C. for 80-120 seconds, and then curing at a temperature of 20-30° C. for 30-80 seconds; the exposing has a light intensity of 60-200 mJ/cm$^2$ and a time of 10-60 seconds, a light source is 200-350 μm from the color resist pattern; the developing has a developer of 0.04%-0.05% KOH solution and a time of 50-100 seconds; the post-baking has a temperature of 80-250° C. and a time of 5-30 minutes.

In an exemplary embodiment, the polyfunctional monomer further includes an acrylate, and the acrylate includes any one or more of pentaerythritol triacrylate (PETA), pentaerythritol tetraacrylate (PETA), polydipentaerythritol pentaacrylate (DPEPA) and hexaacrylate (DPHA).

In an exemplary embodiment, a mass ratio of the divinylbenzene monomer to the acrylate is 1:0 to 1:1.

In an exemplary embodiment, in the color resist material, a proportion of a mass of the resin to a total mass of the color resist material is 5-8%, a proportion of a mass of the polyfunctional monomer to the total mass of the color resist material is 5-8%, a proportion of a mass of the photoinitiator to the total mass of the color resist material is 0.2-0.6%, a proportion of a mass of the pigment to the total mass of the color resist material is 5-8%, a proportion of a mass of the pigment dispersant to the total mass of the color resist material is 5-8%, a proportion of a mass of the solvent to the total mass of the color resist material is 67-78%, and a proportion of a mass of the additive to the total mass of the color resist material is 0.1-0.4%.

DETAILED DESCRIPTION

Figure 1:
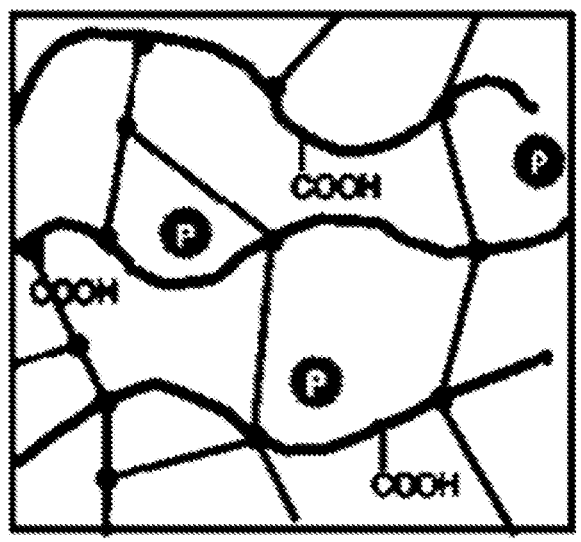
FIG. 1 is a schematic structural view of curing of a color resist material in the prior art.

The present disclosure will be further described in detail below with reference to the accompanying drawings and embodiments. It is to be understood that the specific embodiments described herein are only used to explain the present disclosure and are not intended to limit the present disclosure. It should also be noted that for ease of description, only some of the structures related to the present disclosure rather than all structures are shown in the drawings.

The present disclosure provides a color resist material of a color filter, including: a polyfunctional monomer including a divinylbenzene monomer.

Figure 2:
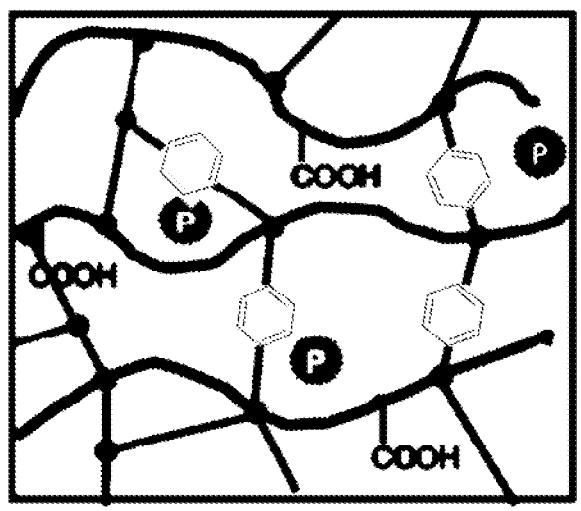
FIG. 2 is a schematic structural diagram of curing of a color resist material provided by an embodiment of the present disclosure.

FIG. 1 is a schematic structural view of curing of a color resist material in the prior art. FIG. 2 is a schematic structural diagram of curing of a color resist material provided by an embodiment of the present disclosure.

As shown in FIG. 2, compared to the color resist material of the related art, a large π bond structure of a benzene ring is introduced after the color resist material provided in the embodiment of the present disclosure is cured.

The color resist material is doped with divinylbenzene, and the large π bond structure of the benzene ring is introduced, which reduces a node loss rate of the color resist in the electric field and improves the electrical stability of the color resist. The divinylbenzene has two vinyl groups, which will not significantly reduce the crosslinking degree and structural stability of the color resist material. The benzene ring structure has high light-resistance and heat-resistance properties. The divinylbenzene has low polymerization conditions and material polymerization may be accelerated by an initiator in ultraviolet, visible, and high temperature environments, which does not change the existing process flow and parameters. The introduced divinylbenzene is a non-polar group. The polymerized divinylbenzene has high light-transmitting properties of polystyrene and does not affect the transmittance.

Through the color resist material of a color filter provided by the present disclosure, a color resist pattern of the color filter may be prepared, which improves electrical stability of the color resist pattern, reduces defect of mura of the light irradiation, especially defect of mura of the green light irradiation.

The color resist material of a color filter and the method for preparing a color resist pattern of a color filter provided by the present disclosure will be described below with reference to specific embodiments.

The present embodiment provides a color resist material of a color filter, including resin matrix, a polyfunctional monomer, a photoinitiator, a pigment, a pigment dispersant, a solvent, and an additive.

The resin matrix includes one of a methyl methacrylate (MMA) agent and butyl methacrylate (BMA) or a combination thereof. The mass of the resin matrix accounts for 5-8% of the total mass of the color resist material.

Figure 3:
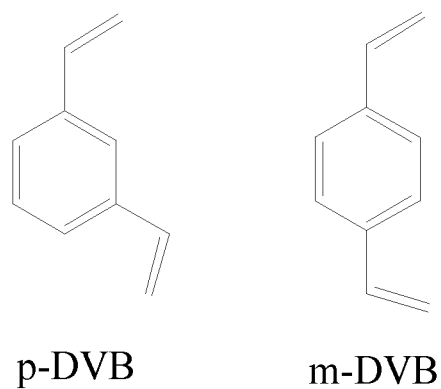
FIG. 3 is a schematic structural diagram of divinylbenzene in the embodiments of the present disclosure.

The polyfunctional monomer includes divinylbenzene (DVB), and its schematic structural diagram is shown in FIG. 3. The mass of the polyfunctional monomer accounts for 5-8% of the total mass of the color resist material. Only the divinylbenzene (DVB) is used as the polyfunctional monomer: the resulting product has the largest charge trapping capability, i.e., the dielectric loss factor is the lowest. However, since the DVB has less branched chains than the acrylate, the overall crosslinking degree decreases.

In another implementation, the polyfunctional monomer includes divinylbenzene (DVB) and other polyfunctional monomers, such as acrylates. The DVB and the acrylate are doped, such that the resulting product has decreased dielectric loss factor and improved charge trapping capability to some extent and meanwhile the overall crosslinking degree is less decreased.

Figure 4A:
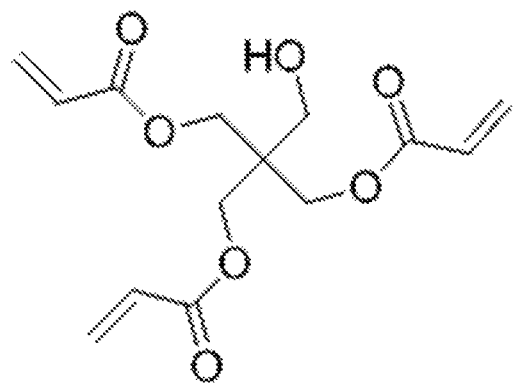
FIGS. 4a to 4d are schematic structural views of other polyfunctional monomers in the embodiments of the present disclosure.
Figure 4B:
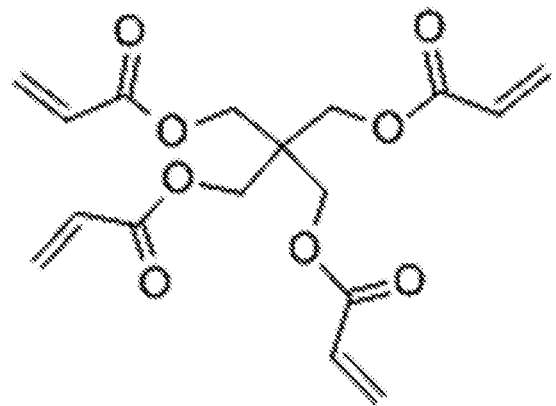
Figure 4C:
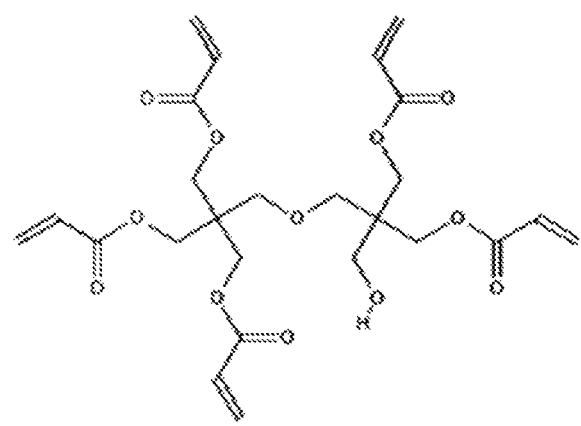
Figure 4D:
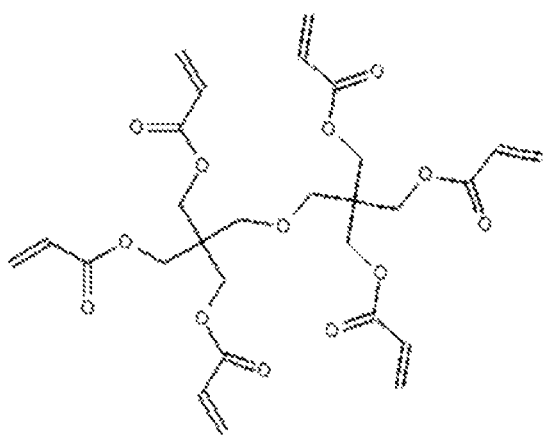

FIGS. 4a to 4d are schematic structural views of other polyfunctional monomers in the embodiments of the present disclosure. The acrylate includes any one or more of pentaerythritol triacrylate (PETA) (as shown in FIG. 4a), pentaerythritol tetraacrylate (PETA) (as shown in FIG. 4b), polydipentaerythritol pentaacrylate (DPEPA) (as shown in FIG. 4c) and hexaacrylate (DPHA) (as shown in FIG. 4d).

A ratio of the divinylbenzene (DVB) to the acrylate is 1:0~1:1. The DVB is the most fundamental material for improving the electrical stability of the color resist pattern. The more the content is, the better the effect will be. However, the more the DVB content is, the lower the crosslinking degree of the product will be. In order to give consideration to the DVB content and the crosslinking degree of the product, the mass ratio of the divinylbenzene (DVB) and acrylate may be set to 1:0.5 to 1:0.8. In this case, the total mass of the polyfunctional monomer accounts for 5-8% of the total mass of the color resist material.

The Photoinitiator may include benzophenone or S-triazine. A proportion of a mass of the photoinitiator to the total mass of the color resist material is 0.2-0.6%.

The pigment may include any one of a blue pigment, a red pigment, and a green pigment. A proportion of a mass of the pigment to the total mass of the color resist material is 5-8%. The blue pigment includes copper phthalocyanine, the green pigment includes copper phthalocyanine halides or zinc phthalocyanine halides, and the red pigment includes bis(p-chlorophenyl)-1,4-diketopyrrolopyrrole. In an exemplary implementation, the pigment is a green pigment.

The pigment dispersant is a polymer dispersant (ZetaSperse 2500, etc.), and a proportion of a mass of the pigment dispersant to the total mass of the color resist material is 5-8%.

The solvent is propylene glycol methyl ether acetate (PGMEA), and a proportion of a mass of the solvent to the total mass of the color resist material is 67-78%.

The additive is a silane coupling agent, and a proportion of a mass of the additive to the total mass of the color resist material is 0.1-0.4%.

Figure 5A:
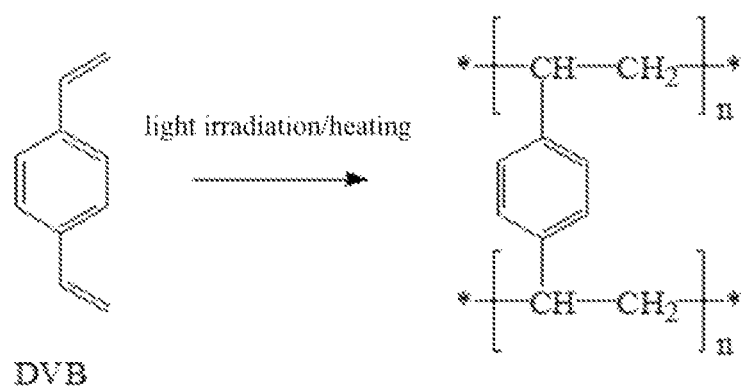
FIGS. 5a to 5b are relevant major crosslinking reactions of divinylbenzene in the embodiments of the present disclosure.
Figure 5B:
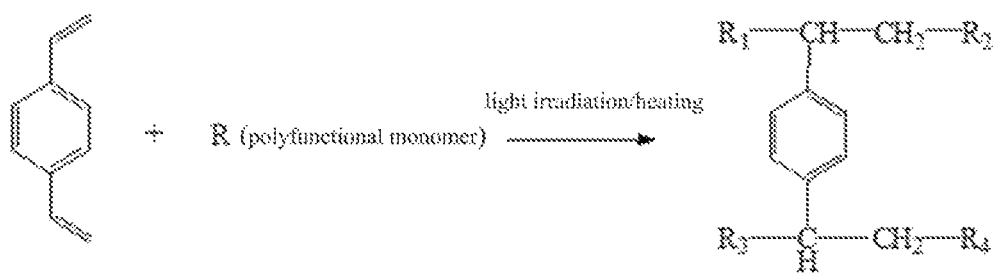

FIGS. 5a to 5b are relevant major crosslinking reactions of divinylbenzene in the embodiments of the present disclosure.

In the color resist material of a color filter provided in this embodiment, the polyfunctional monomer has two kinds. In one kind, the polyfunctional monomer only includes the divinylbenzene (DVB). In this case, the crosslinking reaction of the DVB after being irradiated/heated is shown in FIG. 5a.

In the other kind, the polyfunctional monomer includes other polyfunctional monomers, such as the acrylate described above, in addition to the divinylbenzene (DVB). In this case, the crosslinking reaction of the DVB and other polyfunctional monomers after being irradiated/heated is shown in FIG. 5b.

The color resist material provided by the present embodiment is doped with divinylbenzene, and the large π bond structure of the benzene ring is introduced, which reduces a node loss rate of the color resist in the electric field and improves the electrical stability of the color resist. The divinylbenzene replaces a part or all of other polyfunctional monomers, which will not significantly reduce the crosslinking degree and structural stability of the color resist material, and material polymerization may be accelerated by an initiator in ultraviolet, visible, and high temperature environments.

The present embodiment provides a method for preparing a color resist pattern of a color filter, which is prepared by using the color resist materials provided in the above embodiments. The method includes following steps.

First, ingredients are mixed. A certain proportion of the various components included in the color resist material described in the above embodiment, such as resins, polyfunctional monomers, photoinitiators, pigments, pigment dispersants, solvents, and additives is selected within the above proportion range, then mixed, and dispersed by ultrasonic for 30 minutes, to obtain a color resist material solution for preparing a color resist pattern.

Next, the mixed and dispersed color resist solution is subjected to coating, pre-curing, exposing, developing, post-baking and other technical processes.

The pre-curing process includes: curing at a temperature of 80-100° C. for 80-120 seconds, and then curing at a temperature of 20-30° C. for 30-80 seconds. The pre-curing plays a role of evaporating a part of the solvent, and initially hardening the coated liquid mixing glue. The higher the temperature is, the shorter time it takes. The curing temperature and the curing time have constraints of a range. The lower the temperature is, the poorer the pre-curing effect will be. The shorter the time is, the poorer the pre-curing effect will be. In the present embodiment, by curing at a temperature of 80-100° C. for 80-120 seconds and then curing at a temperature of 20-30° C. for 30-80 seconds, both the curing temperature and the curing time may be considered, and a better curing effect is obtained.

The exposing has a light intensity of 60-200 mJ/cm$^2$ and a time of 10-60 seconds. The light intensity of the exposing is determined by the light source capability of the device. Within the adjustable range of 60-200 mJ/cm$^2$, the greater the light intensity is, the faster the reaction speed of the initiator will be, the less time it takes, which is more favorable for the preparation. The exposing time is determined by the light intensity and the reaction time of the initiator. The greater the light intensity is, the shorter the time will be. However, it also takes time for the initiator to react, so the time cannot be too short.

A distance between the light source and the color resist pattern is 200-350 μm. The distance of the light source is determined by the device. The 200-350 μm is an adjustable range. The closer the distance is, the greater the illumination dose rate will be, the higher the energy will be, and the larger the corresponding light intensity will be.

The developing has a developer of 0.04%-0.05% KOH solution and a time of 50-100 seconds. The KOH solution is a weak base and can remove unexposed polymerized parts. The concentration is adjustable. The greater the concentration is, the shorter the time will be. However, there is a risk of insufficient removal if the time is too short, so there is a lower time requirement. In the present embodiment, the above-mentioned developing time is selected.

The post-baking has a temperature of 80-250° C. and a time of 5-30 minutes. The temperature range of the post-baking temperature is determined by reaction types of branched chains such as initiators, polyfunctional monomers, and resins. The role of the baking is to make the material left by the developing complete the further reaction, since the exposing reaction will not be sufficient, the resist pattern will be completely cured only after the final heating reaction. The higher the temperature is, the faster the reaction speed will be, the faster the curing rate will be, the shorter the time will be. Similarly, there is a risk of insufficient curing if the time is too short, so there is a lower requirement. In the present embodiment, the above-mentioned post-baking temperature and time are selected.

It should be understood by those skilled in the art that the present disclosure is not limited to the specific embodiments described herein, and various obvious changes, readjustments, and substitutions can be made by those skilled in the art without departing from the protection scope of the present disclosure. Therefore, although the present disclosure has been described in more detail through the above embodiments, the present disclosure is not limited to the above embodiments, and other equivalent embodiments may also be included without departing from the concept of the present disclosure. The scope of the present disclosure is determined by the appended claims.

What is claimed is:

1. A color resist material of a color filter, comprising:
a polyfunctional monomer comprising a divinylbenzene monomer and an acrylate, a mass ratio of the divinylbenzene monomer to the acrylate is 1:0 to 1:1;
a resin, a photoinitiator, a pigment, a pigment dispersant, a solvent, and an additive;
in the color resist material, a proportion of a mass of the resin to a total mass of the color resist material is 5-8%, a proportion of a mass of the polyfunctional monomer to the total mass of the color resist material is 5-8%, a proportion of a mass of the photoinitiator to the total mass of the color resist material is 0.2-0.6%, a proportion of a mass of the pigment to the total mass of the color resist material is 5-8%, a proportion of a mass of the pigment dispersant to the total mass of the color resist material is 5-8%, a proportion of a mass of the solvent to the total mass of the color resist material is 67-78%, and a proportion of a mass of the additive to the total mass of the color resist material is 0.1-0.4%; and a large π bond structure of a benzene ring is introduced after the color resist material is cured.

2. The color resist material of a color filter according to claim 1, wherein the acrylate is selected from a group consisting of pentaerythritol triacrylate (PETA), pentaerythritol tetraacrylate (PETA), polydipentaerythritol pentaacrylate (DPEPA) and hexaacrylate (DPHA).

3. The color resist material of a color filter according to claim 1, wherein the resin comprises one of a methyl methacrylate (MMA) agent and butyl methacrylate (BMA) or a combination thereof.

4. The color resist material of a color filter according to claim 1, wherein the solvent comprises propylene glycol methyl ether.

5. The color resist material of a color filter according to claim 1, wherein the photoinitiator comprises Benzophenone or S-triazine.

6. The color resist material of a color filter according to claim 1, wherein the additive comprises a silane coupling agent.

7. The color resist material of a color filter according to claim 1, wherein the pigment comprises a green pigment.

8. The color resist material of a color filter according to claim 1, wherein the pigment dispersant comprises a polymer dispersant.

9. A method for preparing a color resist pattern of a color filter, comprising:
preparing a color resist material solution comprising a polyfunctional monomer, the polyfunctional monomer comprising a divinylbenzene monomer and an acrylate, a mass ratio of the divinylbenzene monomer to the acrylate is 1:0 to 1:1; and
fixing the prepared color resist material solution on the color filter, to obtain a color resist pattern;
wherein the preparing a color resist material solution comprising a polyfunctional monomer comprises mixing the polyfunctional monomer, a resin, a photoinitiator, a pigment, a pigment dispersant, a solvent, and an additive;
in the color resist material, a proportion of a mass of the resin to a total mass of the color resist material is 5-8%, a proportion of a mass of the polyfunctional monomer to the total mass of the color resist material is 5-8%, a proportion of a mass of the photoinitiator to the total mass of the color resist material is 0.2-0.6%, a proportion of a mass of the pigment to the total mass of the color resist material is 5-8%, a proportion of a mass of the pigment dispersant to the total mass of the color resist material is 5-8%, a proportion of a mass of the solvent to the total mass of the color resist material is 67-78%, and a proportion of a mass of the additive to the total mass of the color resist material is 0.1-0.4%; and a large π bond structure of a benzene ring is introduced after the color resist material is cured.

10. The method for preparing a color resist pattern of a color filter according to claim 9, wherein the fixing the prepared color resist material solution on the color filter, to obtain a color resist pattern comprises curing, exposing, developing, and post-baking steps, the curing comprises curing at a temperature of 80-100° C. for 80-120 seconds, and then curing at a temperature of 20-30° C. for 30-80 seconds; the exposing has a light intensity of 60-200 mJ/cm² and a time of 10-60 seconds, a light source is 200-350 μm from the color resist pattern; the developing has a developer of 0.04%-0.05% KOH solution and a time of 50-100 seconds; the post-baking has a temperature of 80-250° C. and a time of 5-30 minutes.

11. The method for preparing a color resist pattern of a color filter according to claim 9, and the acrylate comprises any one or more of pentaerythritol triacrylate (PETA), pentaerythritol tetraacrylate (PETA), polydipentaerythritol pentaacrylate (DPEPA) and hexaacrylate (DPHA).

* * * * *